United States Patent

Sideris et al.

[11] Patent Number: 5,923,148
[45] Date of Patent: *Jul. 13, 1999

[54] ON-LINE BATTERY MONITORING SYSTEM WITH DEFECTIVE CELL DETECTION CAPABILITY

[75] Inventors: Antonios G. Sideris, Marietta, Ga.; Paris H. Wiley, Tampa, Fla.

[73] Assignee: Aims System, Inc., Knoxville, Tenn.

[*] Notice: This patent is subject to a terminal disclaimer.

[21] Appl. No.: 08/971,701

[22] Filed: Nov. 17, 1997

Related U.S. Application Data

[63] Continuation of application No. 08/595,304, Feb. 1, 1996, Pat. No. 5,710,503.

[51] Int. Cl.⁶ .......................... H02J 7/00; G01N 27/416
[52] U.S. Cl. ................................ 320/116; 324/429
[58] Field of Search .................................. 320/116, 118, 320/DIG. 12, DIG. 13; 324/429, 430

[56] References Cited

U.S. PATENT DOCUMENTS

| | | |
|---|---|---|
| 4,352,067 | 9/1982 | Ottone . |
| 4,707,795 | 11/1987 | Alber et al. . |
| 4,888,716 | 12/1989 | Ueno . |
| 5,027,294 | 6/1991 | Fakruddin et al. . |
| 5,047,961 | 9/1991 | Simonsen . |
| 5,193,067 | 3/1993 | Sato et al. . |
| 5,206,578 | 4/1993 | Nor . |
| 5,268,845 | 12/1993 | Startup et al. . |
| 5,287,286 | 2/1994 | Ninomiya . |
| 5,295,078 | 3/1994 | Stich et al. . |
| 5,311,441 | 5/1994 | Tayama et al. . |
| 5,321,626 | 6/1994 | Palladino et al. . |
| 5,349,535 | 9/1994 | Gupta et al. . |
| 5,450,007 | 9/1995 | Payne et al. . |
| 5,504,415 | 4/1996 | Podrazhansky et al. . |
| 5,710,503 | 1/1998 | Sideris et al. ........................ 324/431 |

*Primary Examiner*—Edward H. Tso
*Assistant Examiner*—Gregory J. Toatley, Jr.
*Attorney, Agent, or Firm*—Blank Rome Comisky & McCauley LLP

[57] ABSTRACT

An on-line battery monitoring system for monitoring a plurality of battery cells identifies and computes individual cell and battery bank operating parameters. The system comprises a controller for designating a given battery cell to be monitored, a multiplexer responsive to designation by the controller for selecting a given battery cell to be monitored or for selecting a battery pack to be monitored, an analog board for receiving electrical signals from a given battery cell for providing an output representing measurement of a parameter (voltage, temperature, and the like) of the given battery cell, a voltage sensor circuit for sensing voltage appearing across positive and negative terminals of the battery pack, and a control board responsive to address information for selectively initiating a load test, battery bank charging, or common-mode voltage measurement.

2 Claims, 7 Drawing Sheets

ON-LINE BATTERY MONITORING SYSTEM WITH DEFECTIVE CELL DETECTION CAPABILITY

This application is a continuation of 08/595,304, filed Feb. 1, 1996, now U.S. Pat. No. 5,701,503.

TECHNICAL FIELD

The present invention generally relates to an on-line battery monitoring system, and more particularly an emergency battery on-line monitoring system which is capable of identifying and computing individual cell and battery bank operating parameters by means of a relatively simple, non-intrusive, fully electronic, remote monitoring system which does not require the use of probes or other measuring instruments.

BACKGROUND ART

Lead acid and calcium batteries have been in use in industrial plants for more than a hundred years. Such batteries are usually arranged in banks of individual cells of 2 VDC (volts direct current), and such banks of batteries typically power direct current emergency buses which are normally rated between 48 VDC and 250 VDC. Industrial batteries are simple, chemical reaction devices, but their operating characteristics are relatively complex and vary considerably because they are dependent upon battery construction, manufacturing material and processes, ambient temperatures, aging, use and other factors.

A relative newcomer to the battery industry is the valve regulated lead acid (VRLA) battery technology utilized extensively in 48 VDC applications within the communications industry. VRLA batteries are used because they are smaller, lighter and require less maintenance than conventional flooded lead acid cells. However, VRLA batteries are less durable and are more sensitive to high temperature conditions and improper charging, and this has led to premature failures of the VRLA batteries in many applications.

As a result of the foregoing considerations, periodic surveillance testing methods have been utilized to ensure that battery cells and banks are and remain in a condition of operational readiness. Such testing methods are dependent on periodic measurement of the float charge at the battery terminals, charger output current and voltage, electrolyte levels, cell temperatures, pilot cell voltage and specific gravity, and such testing is also dependent on periodic discharge testing of the battery bank. However, this type of surveillance has several inherent problems: it is very labor intensive, and thus very expensive to perform; its accuracy is not always dependable since it relies on inaccurate instruments and techniques which do not always compensate for such parameters as temperature, aging, environmental factors, and specific charge-discharge characteristics; load testing usually requires disconnection of the emergency battery bank from its critical load and also on drawing the battery state of charge to very low levels; load testing of the battery bank is the only way to ensure battery performance and is the best way to detect cable continuity and degradation of material because of oxidation or other chemical deterioration, and thus the reliability of the system is virtually unknown between tests; trend analysis of cell operational parameters is not performed during load testing (for example, when temperatures are abnormally increasing, internal cell faults may go unnoticed); there is no accurate indicator to predict that, after a full load testing, each battery cell will perform the same as before the test; and emergency stand-by or uninterruptible power supply (UPS) batteries, which are continuously on a floating charge and are not often exercised, tend to deteriorate faster than working batteries and to require "stabilizing charges" more often, and both of these conditions increase operational and maintenance costs.

In evaluating systems of the prior art, it is important to note that the measurement of cell conductance or open-circuit voltage does not provide a good indication of battery capacity or ability to carry a load for a predetermined time. A half-discharged battery may show a voltage near to its fill charge after a period of rest, and any correlation between cell conductance and capacity is speculative.

Finally, there have been two ways in the prior art to calculate accurately the state of charge: the "rate dependent capacity" method and the "model based" method. Both of these methods require the measurement of operational parameters, such as voltage, specific gravity of the electrolyte, temperature, transient discharges, battery specific characteristics, and other parameters. Moreover, both of these methods are labor intensive, and require local battery surveillance and maintenance.

Therefore, there is a need in the prior art for an on-line battery monitoring system which ensures readiness and reliability of UPS and emergency battery systems, while eliminating labor intensive surveillance testing, extending the life of the cells, and allowing for remote monitoring and testing of emergency battery systems. There is also a need in the prior art for such an on-line battery monitoring system which performs these services with high accuracy and reliability while never removing the batteries from their normal service.

There is also a need in the prior art for the development of an on-line battery monitoring system which performs non-intrusive testing, accurately and remotely monitors the condition and operability of industrial UPS and emergency battery systems, and automatically determines the following conditions for individual cells and battery banks: state of charge, capacity, location and magnitude of grounds, location and magnitude of connection degradation, and internal cell faults and degrading conditions.

The following U.S. pat. Nos. are considered to be representative of the prior art relative to the invention disclosed herein: 4,707,795; 4,888,716; 5,027,294; 5,047,961; 5,193,067; 5,268,845; 5,287,286; 5,295,078; 5,311,441; 5,321,626; 5,349,535; and 5,450,007. However, none of the patents cited above provides the capabilities or functions provided by the system of the present invention. For example, the systems previously disclosed do not perform some or all of the following functions: battery bank capacity testing, battery cell capacity testing, accurate calculation of individual cell SOC, non-intrusive cell electrolyte level indication, leakage resistance testing to earth ground, and customized battery monitoring. Other features not disclosed in the prior art will become evident from the detailed disclosure set forth below.

DISCLOSURE OF INVENTION

The present invention generally relates to an on-line battery system, and more particularly, an emergency battery on-line monitoring system which is capable of identifying and computing individual cell and battery bank operating parameters with a simple, non-intrusive, fully electronic, remote monitoring system which does not require the use of probes or other measuring instruments. In general, the monitoring system of the present invention provides continuous or periodic operability information on each battery cell within a bank of battery cells, including state of charge (SOC), internal faults, and magnitude and location of both grounds and degraded connections. The system of the present invention performs a short periodic load test to assess bank integrity and to provide data to compute capacity and to independently verify the SOC. In accordance with the present invention, the batteries are charged only when needed, thus increasing the remaining cell lives of the batteries and extending new cells lives beyond normal expectations. Furthermore, the inventive system computes the SOC and the capacity of each cell and each bank at periodic intervals with high accuracy so as to determine charging or preventive maintenance needs.

Furthermore, the monitoring system of the present invention ensures the readiness and reliability of emergency battery systems, while also. eliminating labor intensive surveillance testing, extending the life of the cells, and allowing for the remote monitoring and testing of emergency battery systems. These functions are performed with relatively high accuracy and reliability, and without ever removing the batteries from their normal service. The system of the present invention has been developed as a non-intrusive testing system for the accurate and remote monitoring of the condition and operability of industrial emergency battery systems, and automatically determines the following conditions for individual cells and battery banks: SOC, capacity, location and magnitude of grounds, location and magnitude of connection degradation, and internal cell faults and degrading conditions.

The inventive system, due its high accuracy, is able to manage battery bank charging, thereby eliminating the need for continuous floating charge, and consequently extending the life of cells. The system of the present invention uses no additional probes or instrumentation, is 100 percent non-intrusive, and performs its functions without removing the batteries from service.

Other features of the inventive battery monitoring system include the following: immediate local and remote alarm generation for out-of-limit parameters and downscale conditions; extremely high accuracy (better than 98 percent) on all measurements and in its calculation of SOC for each battery cell, or for the bank as a whole, calculated by two independent methods; automatic operation of contactors and relays needed to configure the battery bank for testing or charging; flexible operating modes which can be entered manually or remotely, including the provision of programmable tests schedules, periodicities, changes of set points, and changes to the programming code; accurate and reliable data for the calculation of cell and bank degradation for the determination of predictive maintenance and preventive maintenance needs; and centralization of system operation, data acquisition, and data analysis in one location for an entire power plant system, industrial complex or telecommunications system.

The on-line battery monitoring system of the present invention, as disclosed herein, achieves significant savings as a result of its ability to greatly increase the operational reliability of the DC emergency bus, ensuring that the bus is available to power critical systems in the event of a loss of normal power. The consequences of a total black-out on health and safety or business losses, as well as the cost of recovery of certain processes after such an event has occurred, readily justifies the installation of the system of the present invention. The savings achieved by the present invention can be summarized as follows: significant improvement in the reliability of the emergency battery bank; reduction and prediction of cell failures; an increase in cell life through charge management; a reduction in labor and maintenance costs normally required for battery surveillance, maintenance, troubleshooting and replacement; tile generation of alarms indicating cell failures or out-of-specification conditions; the provision of an early indication of a degrading battery cell capacity and/or system ground faults; the elimination of labor-intensive, intrusive, periodic surveillance testing; and improvement in the ability to determine battery service and replacement requirements. In addition, the invention eliminates the need for manual testing of cell voltage measurements, cell specific gravity measurements, cell temperature measurements, float voltage measurements at the battery terminals, battery impedance or conductance testing, connection resistance measurements, and performance load testing.

Therefore, it is a primary object of the present invention to provide an on-line battery monitoring system.

It is an additional object of the present invention to provide an emergency battery on-line monitoring system which is capable of identifying and computing individual cell and battery bank operating parameters.

It is an additional object of the present invention to provide an on-line battery monitoring system which employs a simple, non-intrusive, fully electronic, remote monitoring system.

It is an additional object of the present invention to provide an on-line battery monitoring system which does not require the use of probes or other measuring instruments.

It is an additional object of the present invention to provide an on-line battery monitoring system which provides continuous or periodic operability information on each battery cell, including SOC, internal faults, and magnitude and location of both ground faults and degraded connections.

It is an additional object of the present invention to provide an on-line battery monitoring system which performs periodic load testing to assess battery bank capacity and to provide data to compute the capacity and to independently verify the SOC.

It is an additional object of the present invention to provide an on-line battery monitoring system which eliminates the need for continuous floating charge, and consequently extends the life of battery cells.

The above and other objects, and the nature of the invention, will be more clearly understood by reference to the following detailed description, the associated drawings, and the appended claims.

BEST MODE FOR CARRYING OUT THE INVENTION

The invention will now be described in more detail with reference to the various figures of the drawings.

Figure 1:
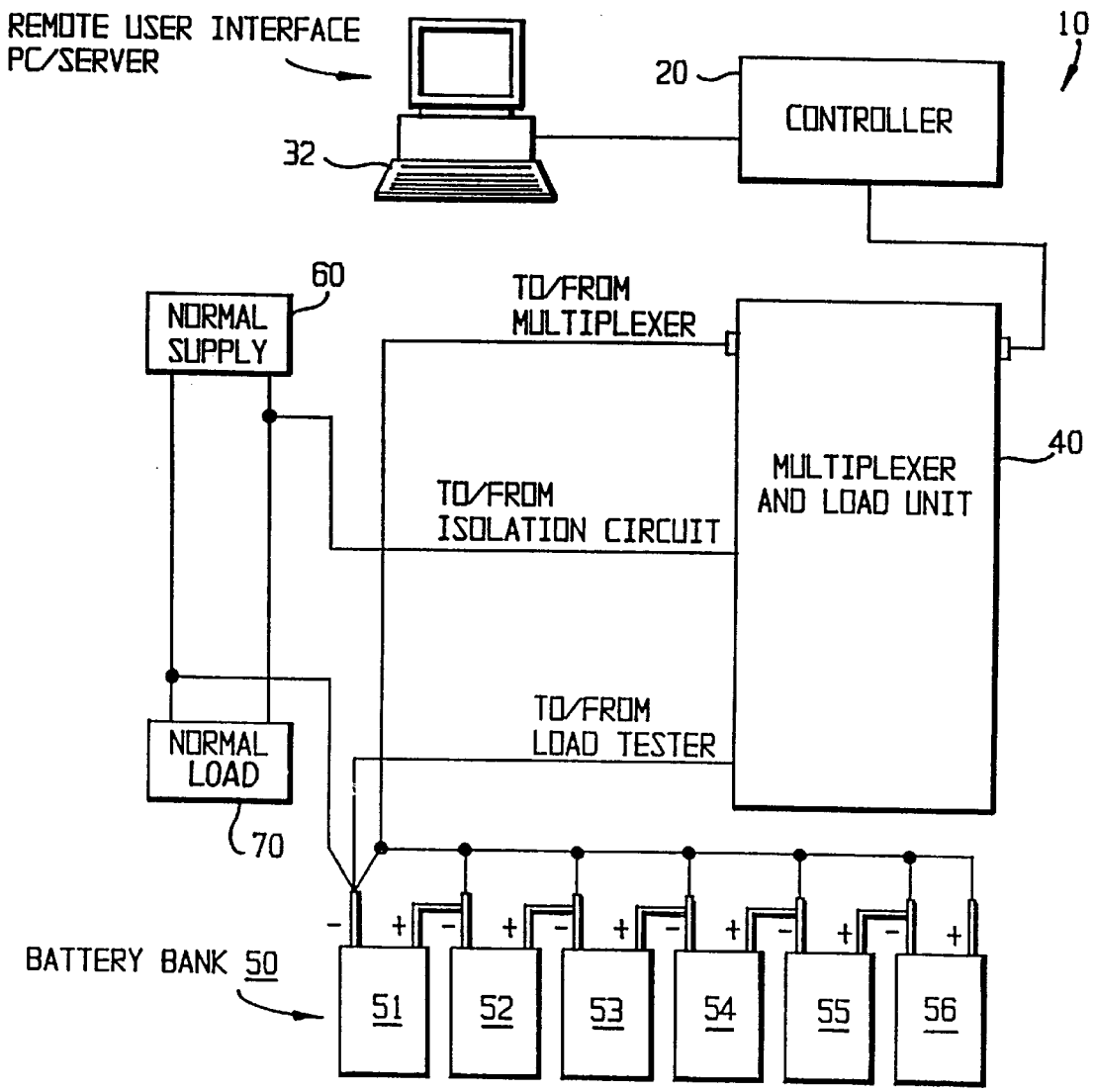
FIG. 1 is a block diagram of the on-line battery monitoring system of the present invention.

FIG. 1 is a block diagram of the on-line battery monitoring system of the present invention. As seen therein, the battery monitoring system 10 basically comprises a controller 20, a remote user interface (personal computer) 32, and a multiplexer and load unit 40 connected to a battery bank 50. The battery bank 50 and a normal supply 60 are connected in parallel to a normal load 70.

Controller 20 is the primary means for controlling the battery monitoring system 10, and in particular the multiplexer and load unit 40. Battery bank 50 comprises a plurality of battery cells 51–56 which are connected, as a back-up system, in parallel with the normal supply 60, the battery bank 50 and normal supply 60 each being connected in series with a normal load 70. In particular, the battery bank 50 is connected to the normal load 70 via an isolation circuit (not shown in FIG. 1) contained within the multiplexer and load unit 40. Multiplexer and load unit 40 also contains a load tester (also not shown in FIG. 1) which is connected to the battery bank 50 for the purpose of load testing the battery bank 50.

Figure 2:
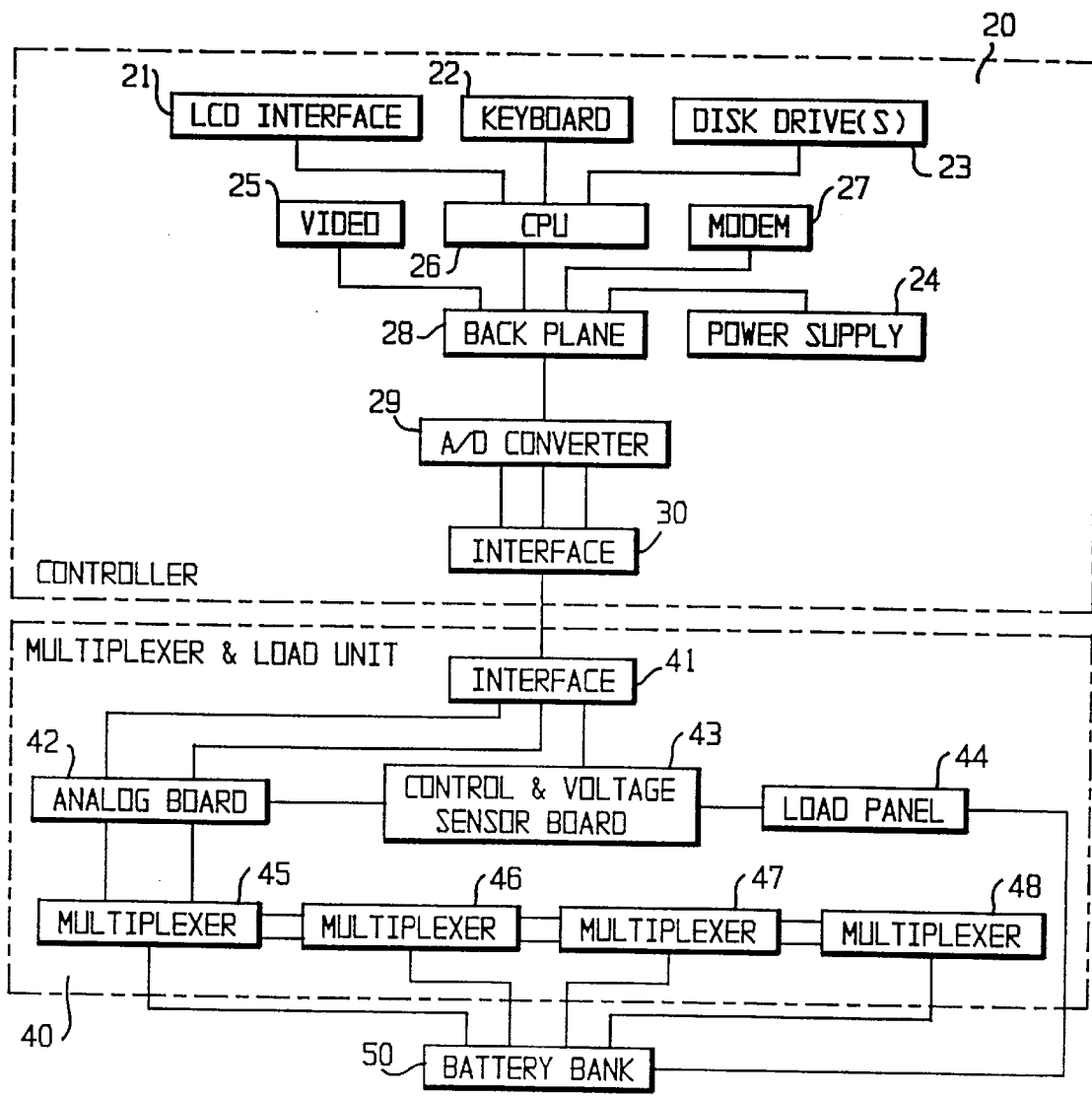
FIG. 2 is a block diagram in more detail of the controller and multiplexer/load unit of the battery monitoring system.

FIG. 2 is a block diagram showing more detail of the controller 20 and multiplexer/load unit 40 of the battery monitoring system.

As seen in FIG. 2, controller 20 basically comprises liquid crystal display (LCD) interface 21, keyboard 22, disk drive(s) 23, power supply 24, video card 25, central processing unit (CPU) 26, modem 27, back plane 28, analog-to-digital (A/D) converter 29, and interface 30.

As also seen in FIG. 2, multiplexer and load unit 40 basically comprises interface 41, analog board 42, control and voltage sensor board 43, load panel 44, and multiplexers 45–48, the latter being connected to the battery bank 50.

Referring to the controller 20 of FIG. 2, the LCD interface 21 provides for the display of indicators relating to the various operational modes of the battery monitoring system 10—specifically, the charging mode, charge recovery mode, wait mode, load test mode, and discharge recovery mode. Keyboard 22 is employed by the user to enter data and control commands relating to the operation of the system 10. Disk drive(s) 23 are utilized to download data from the system 10 to one or more floppy disks, thereby providing another computer with the capability of examining data collected by the controller 20.

Continuing with a description of the controller 20, video card 25 provides a means for comprehensive display of all measured and calculated functions. The CPU 26 is, preferably, implemented by a 386 mother board or other suitable processing/storage component, and is utilized to process data collected by the controller 20 and to store data. Modem 27 is a conventional modem providing telephone communication between the controller 20 and an external computer, such as the remote user interface 32 shown in FIG. 1.

Further continuing with a discussion of controller 20, back plane 28 is a conventional internal connector device for terminating the data paths from the video card 25, CPU 26, and modem 27. Back plane 28 is also a termination device for A/D converter 29, the latter converting received analog data to digital form for processing by or storage in CPU 26. Finally, interface 30 is a conventional interface device.

Referring to multiplexer and load unit 40, interface 41 is a conventional interface device. Analog board 42 functions in a manner to be described below to provide signal conditioning and battery isolation, and produces analog outputs representing battery voltage, temperature and other measurement data. Control and voltage sensor board 43 includes a control circuit 90 (disclosed in FIG. 5 below) and voltage sensor circuitry 120 (disclosed in FIG. 6 below), the board 43 functioning to provide various control and voltage sensing functions. Load panel 44 is basically responsible for performing the load testing functions of the battery monitoring system 10.

Finally, to complete the discussion of multiplexer and load unit 40, the multiplexers 45–48 generally receive measurement data from selected batteries within the battery bank 50, and provide that measurement data to the analog board 42. In particular, in the preferred embodiment of the invention, multiplexers 45, 46 and 47 are each capable of handling eight cells within the battery bank 50, while multiplexer 48 is dedicated to the collection of other measurement data, such as battery pack voltage, and the like.

Figure 3:
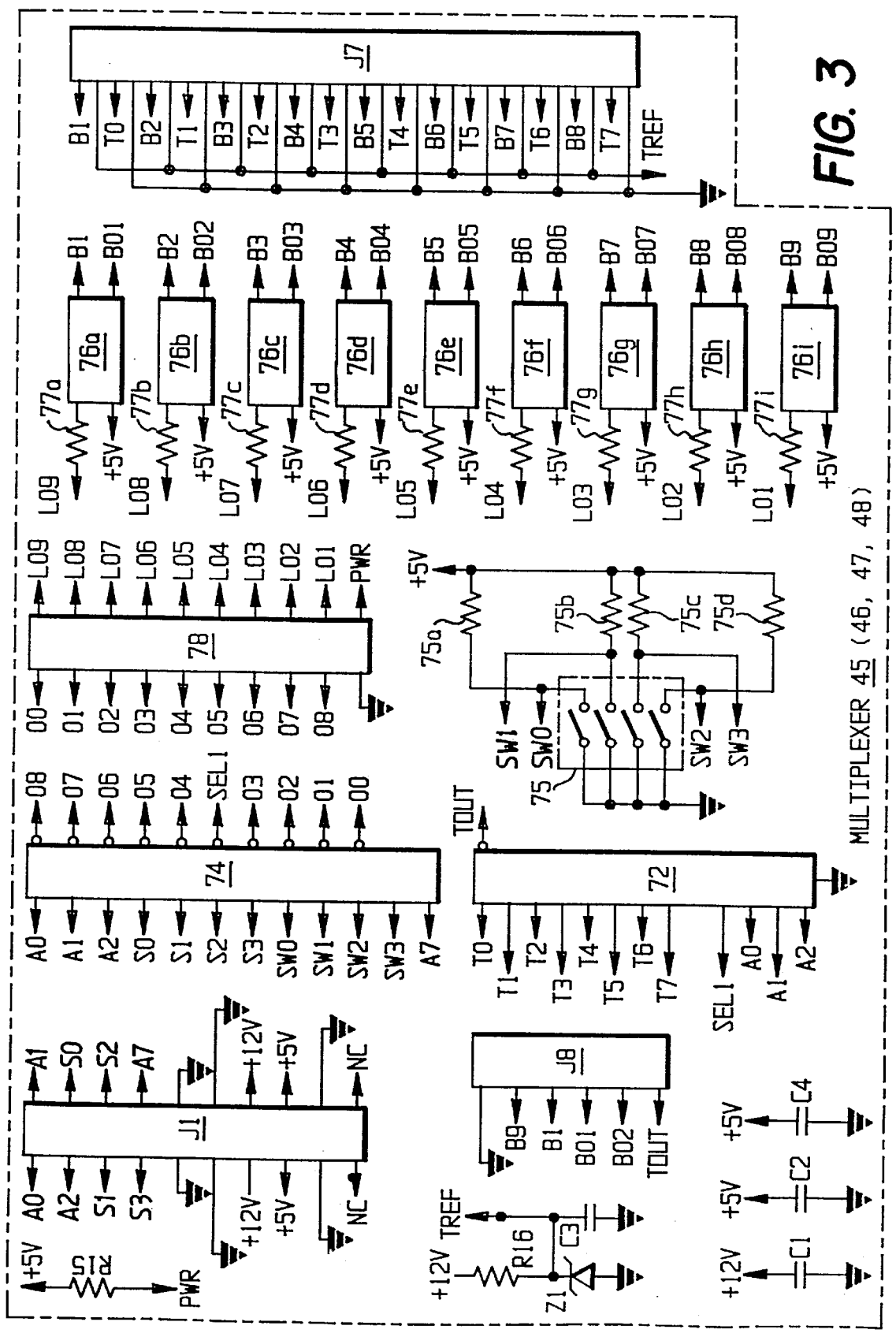
FIG. 3 is a circuit diagram of the multiplexer of the battery monitoring system.

FIG. 3 is a circuit diagram of the multiplexer of the battery monitoring system. That is to say, FIG. 3 is a circuit diagram of a multiplexer implemented as each of multiplexers 45–48 of FIG. 2.

As seen in FIG. 3, multiplexer 45 (46,47,48) basically comprises multiplexer 72, programmable addressable logic (PAL) 74, DIP switches 75, associated resistors 75a–75d, photo metal oxide semiconductor (MOS) relays 76a–76i, associated resistors 77a–77i, and light emitting diode (LED) bank 78. Various other elements are shown in FIG. 3, and perform functions which are obvious from this disclosure. For example, elements J1, J7 and J8 are connectors, elements C1, C2, C3 and C4 are decoupling capacitors, element Z1 is a Zener diode, and elements R15 and R16 are resistors.

In operation, photo MOS relays 76a–76i perform the function of selecting a desired battery from battery bank 50 (FIG. 2) for voltage and temperature measurement. Relays 76a–76i provide an "on" resistance of less than one ohm, while providing 2500-voltage isolation for the battery bank 50. The LED's in LED bank 78 are connected in series with respective relays 76a–76i via resistors 77a–77i, respectively, and provide a visual indication of the particular battery selected in battery bank 50 (FIG. 1).

Multiplexer 72 is connected, via input leads T0–T7, to thermistors (not shown) which are, in turn, connected to each battery within the battery bank 50. Thus, multiplexer 72 performs the function of selecting a corresponding thermistor input for connection, via output signal TOUT, to the analog board 42 of FIGS. 4A and 4B.

DIP switches 75 and associated resistors 75a–75d perform the function of identifying the particular multiplexer position (that is, multiplexer 45, 46, 47 or 48 of FIG. 2) implemented by the multiplexer of FIG. 3. Thus, analog board 42 identifies a particular multiplexer by examining the output provided by switches 75 on the particular multiplexer 45, 46, 47 or 48.

PAL 74 receives and decodes 8-bit address information, and then issues an output which turns on respective photo MOS relays 76a–76i, two at a time. The two photo MOS relays turned on at a given time identify two corresponding batteries at that particular point in time, thereby permitting a voltage reading to be taken across one of the batteries. For example, if two of the relays 76a–76i are turned on, and if these relays correspond to batteries 53 and 54 in battery bank 50, the voltage across battery 53 will be measured. This is due to the fact that, as seen in FIG. 1, the battery terminals are connected in series, the positive terminal of battery 53 being connected to the negative terminal of battery 54, and the negative terminal of battery 53 being connected to the positive terminal of battery 52.

Finally, when a given photo MOS relay from relays 76a–76i is activated, a corresponding output signal is provided via a respective one of the resistors 77a–77i to a corresponding one of the LED's in LED bank 78. This provides an indication to the user as to which of the batteries in battery bank 50 (FIG. 1) has been selected.

Figure 4A:
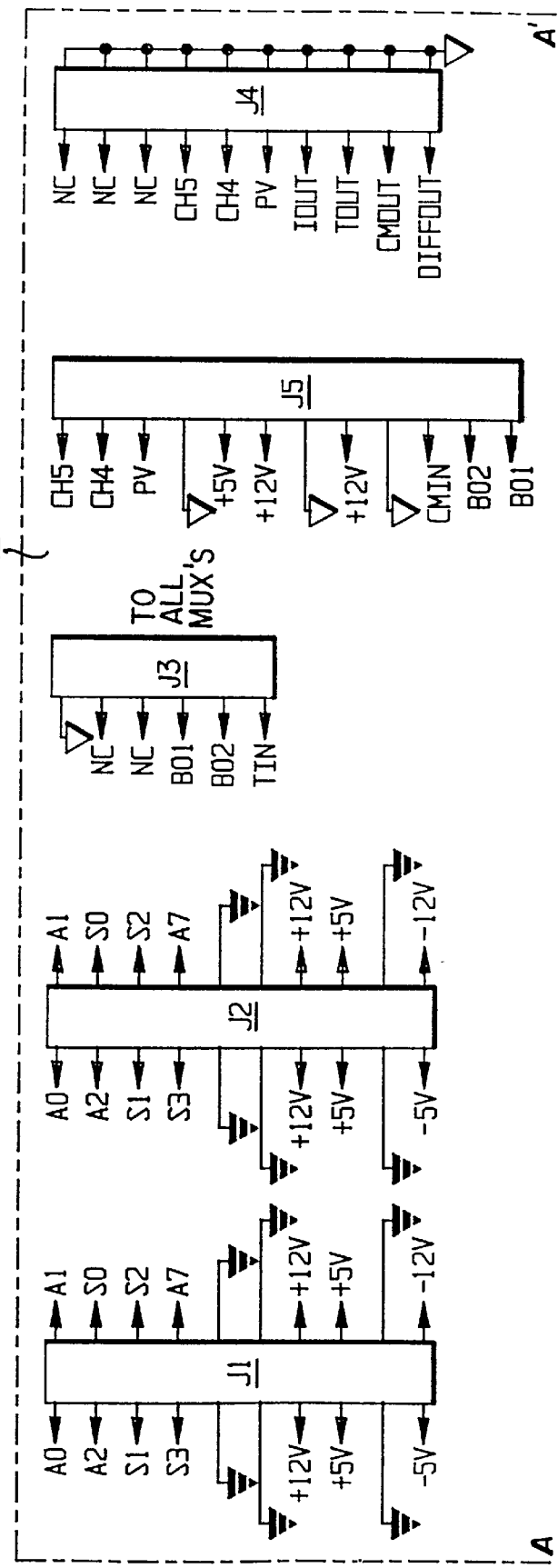
FIGS. 4A and 4B show a circuit diagram of the analog board of the battery monitoring system.
Figure 4B:
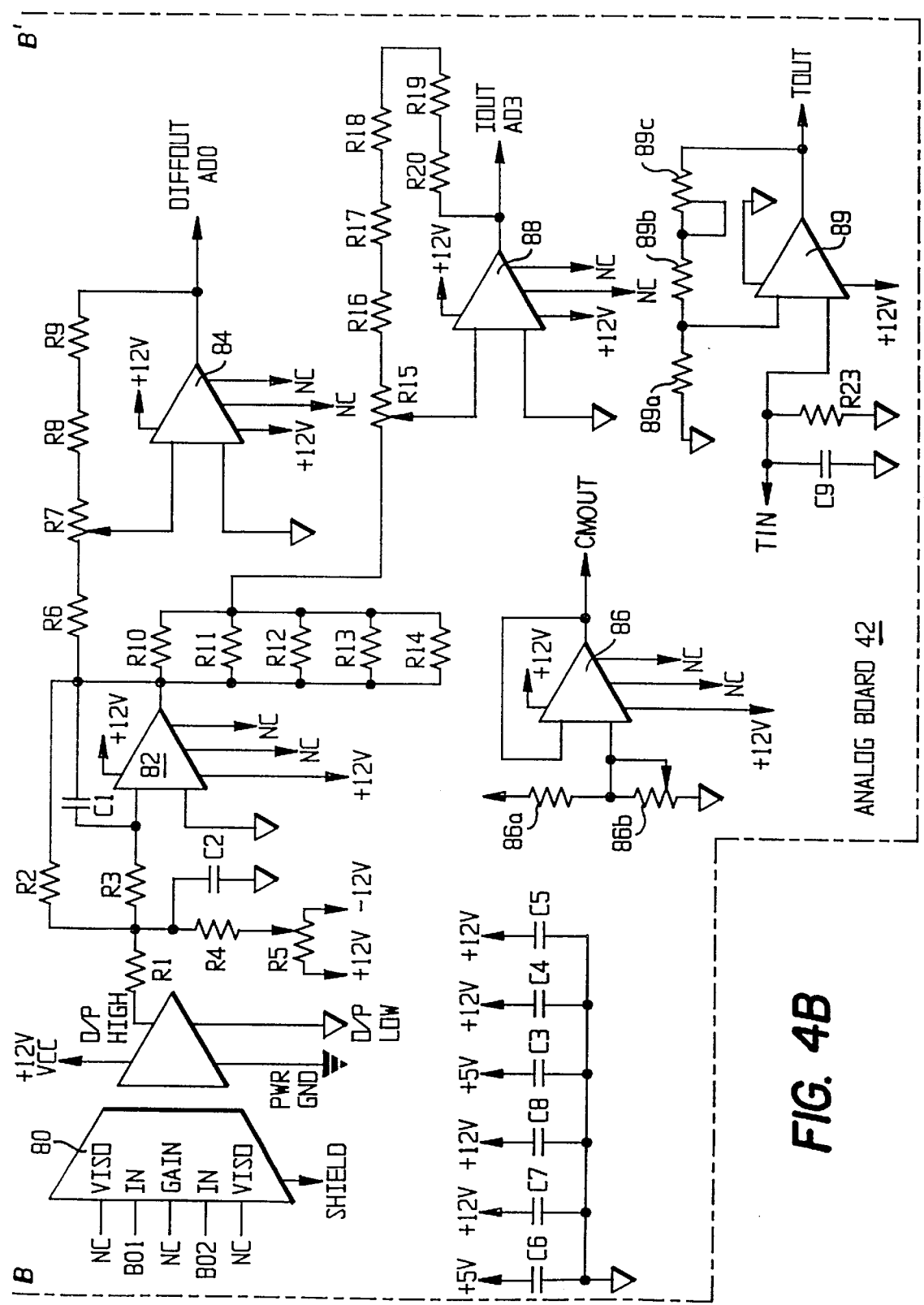

FIGS. 4A and 4B is a circuit diagram of the analog board of the battery monitoring system. As seen therein, analog board 42 basically comprises isolation amplifier 80 and operational amplifiers 82, 84, 86 and 88, with the various resistors and capacitors associated therewith and connected as shown. In addition, analog board 42 includes differential amplifier 89 with associated fixed resistors 89a and 89b and variable resistor 89c. Various other elements are shown in FIG. 4A and 4B, and perform functions which are obvious from this disclosure. For example, elements J1–J5 are connectors, elements C2–C9 are decoupling capacitors, and elements R1–R22 are resistors which are used to balance and calibrate the differential op amp capacity of the analog board 42 of FIGS. 4A and 4B.

Isolation amplifier 80 provides electrical isolation between the inputs BO1 and BO2 from multiplexer 45, earth ground, and the voltage measurement circuitry (operational amplifiers 82, 84, 86 and 88) of the analog board 42 to prevent any faults in the analog board 42 from adversely affecting the equipment of the customer. Isolation amplifier 80 is only bypassed when CMOUT, the voltage between a battery cell and earth ground, is being measured. Measurement of CMOUT requires the creation of a path between input BO2 and earth ground through resistor 86a (preferably, a 10 K resistor) in order to detect any ground faults within the system of the customer.

In operation, when one of the multiplexers 45, 46 or 47 (FIG. 2) selects a particular battery cell in bank 50, the differential cell voltage is provided by multiplexer 45, 46 or 47 to the analog board 42, and more particularly to the BO1 and BO2 inputs of isolation amplifier 80 (FIGS. 4A and 4B). Isolation amplifier 80 is, preferably, an AD248J device (manufactured by Analog Devices) or similar device which provides a precisely controlled gain together with an extremely low offset voltage which permits very accurate measurement of the cell voltage. Isolation amplifier 80 also provides 2500-volt isolation of the battery bank 50 (FIGS. 1 and 2) from earth ground. Operational amplifiers 82 and 84, which are connected in series to the output of isolation amplifier 80, provide gain and offset adjustment for calibration and high frequency rolloff at 5 kHz, respectively. The differential voltage resulting from the operation of analog board 42 is provided as an output DIFFOUT ADC from operational amplifier 84. Moreover, the latter differential voltage output is then provided, via interfaces 41 and 30 (FIG. 2), to the A/D converter 29, wherein it is converted to digital form, and the resulting digital data are provided via back plane 28 to the CPU 26 of controller 20.

The CPU 26 (FIG. 2) provides a control signal CM which functions to select the common mode voltage for measurement. Operational amplifier 86 (FIG. 4B) receives the control signal CM as input CMIN, and generates common mode output control signal CMOUT.

The output CMOUT is the voltage measured between the negative terminal of a particular battery (one of batteries 51–56 of FIG. 1) and earth ground. The negative input BO2 to isolation amplifier 80 is connected to the particular battery in question via multiplexer 45 of FIG. 3, as described above. In a manner to be described in more detail below (with reference to FIG. 5), a control signal is sent by CPU 26 (FIG. 2) to the control and voltage sensor board 43, causing the CMIN input to operational amplifier 86 (FIG. 4) on analog board 42 to be connected to the BO2 input to isolation amplifier 80.

Continuing with the discussion of the operation of FIG. 4A and 4B the circuitry surrounding operational amplifier 86—in particular, voltage divider resistors 86a and 86b—divides the voltage between BO2 (CMIN) and ground by a certain factor (for example, 12), and provides a voltage signal output CMOUT ranging between zero volts and a predetermined value (e.g., +5 volts) which is proportional to the battery voltage measured. The output CMOUT of operational amplifier 86 is then provided as an input to the A/D converter 29 (FIG. 2) and is converted to digital form, the resulting digital data being processed by CPU 26, and then displayed or stored in memory as required. In His manner, the controller 20 of FIG. 2 obtains a measurement of battery cell voltage for a particular battery, as selected by one of the multiplexers 45, 46 or 47.

Further referring to analog board 42 of FIGS. 4A and 4B, differential amplifier 89 receives an input TIN corresponding to the temperature measurement for a particular battery cell selected by the multiplexer 45 of FIG. 3. More specifically, returning to FIG. 3, multiplexer 72 receives temperature measurement data T0–T7 from respective thernistors (not shown) associated with corresponding battery cells within the bank 50 (in FIGS. 1 and 2). Multiplexer 72 selects a particular one of the battery cell temperature measurements for provision, as output TOUT, to the TIN input (the non-inverted input) of differential amplifier 89 (FIGS. 4A and 4B). Differential amplifier 89, with its associated fixed resistors 89a and 89b and associated variable resistor 89c, develops an output temperature measurement TOUT which is provided to the A/D converter 29 (FIG. 2). Converter 29 converts the temperature measurement data to digital form, and then provides that digital data to CPU 26 for further processing and storage, as required.

Figure 5:
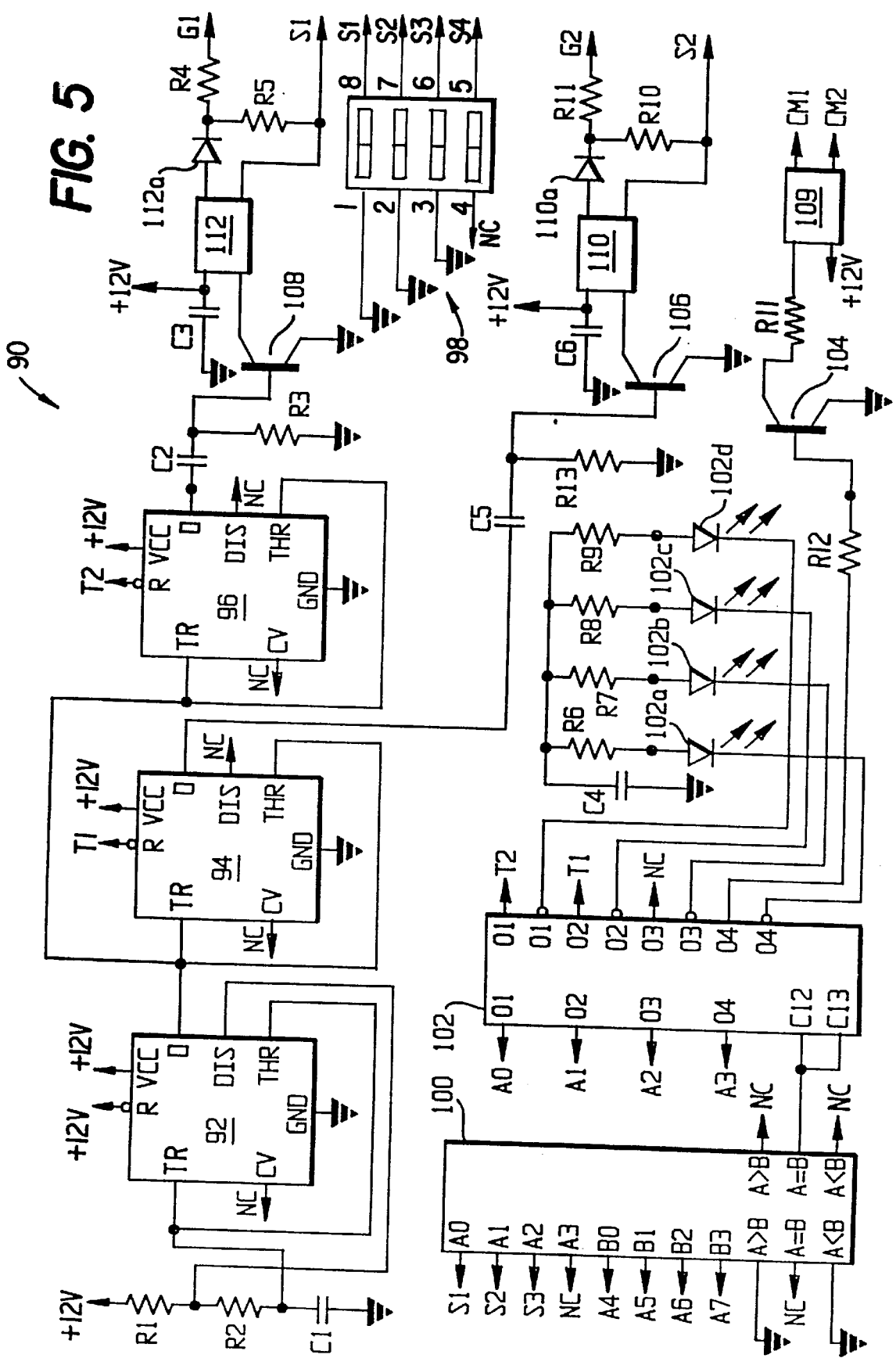
FIG. 5 is a circuit diagram of the control board of the battery monitoring system.

FIG. 5 is a circuit diagram of the control board of the battery monitoring system. As seen therein, control board 90 basically comprises high frequency oscillators 92, 94 and 96, DIP switches 98, decoder 100, latch 102, associated LED's 102a–102d, field effect transistor (FET) 104, further transistors 106 and 108, photo MOS relay 109, pulse transformers 110 and 112, associated rectifiers 110a and 112a, and various capacitors, resistors and other elements connected as shown. Various other elements are shown in FIG. 5, and perform functions which are obvious from this disclosure. For example, elements U9 and U10 are connectors, elements C1–C6 are decoupling capacitors, and elements R1–R14 are resistors used to balance voltages and to provide calibration for various other circuit elements in the control board 50 of FIG. 5.

Oscillator 92 functions as a high frequency oscillator to switch the input voltage at a sufficiently high frequency to use a small pulse transformer (pulse transformers 110 and 112) as an isolation mechanism between the control board 90 and voltages being measured. If no oscillator or isolation transformer were used, the voltage signals could still be measured, but a fault could occur. In accordance with the present invention high frequency oscillator 92 is used, and this permits the use of physically small transformers to provide electrical isolation.

Oscillators 94 and 96 are identical in make-up to the oscillator 92, but merely function as drivers for transistors 106 and 108, respectively.

Figure 7:
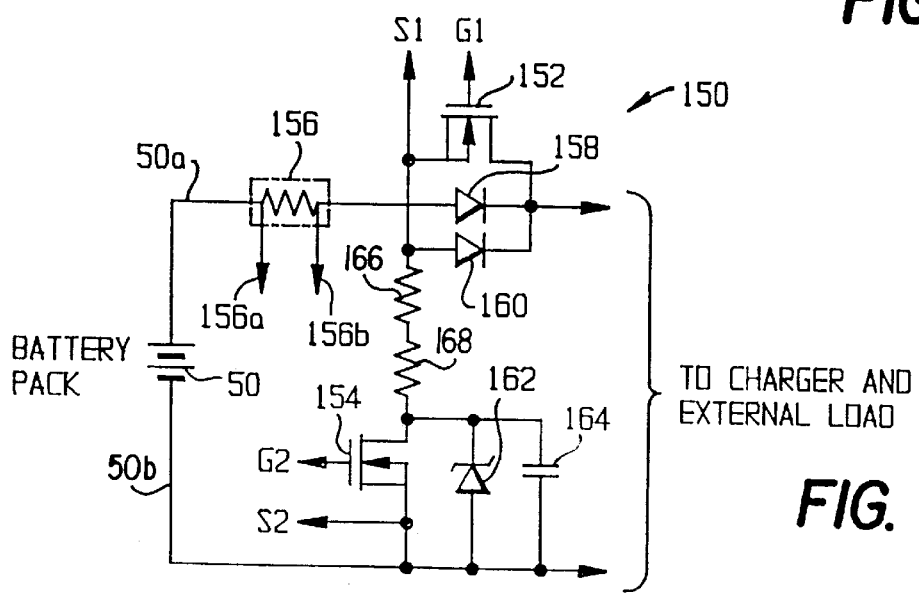
FIG. 7 is a circuit diagram of the load tester and battery isolation circuitry of the battery monitoring system.

Rectifiers 110a and 112a are rectifying diodes which, with their associated resistors and the internal capacitance of switching transistors located in the load panel 44 (FIGS. 2 and 7), perform the function of rectifying and filtering the outputs of pulse transformers 110 and 112, thereby permitting proper switching of the switching transistors located on the load panel 44 (FIG. 2), specifically the load tester 150 of FIG. 7.

Photo MOS relay 109 is used to interconnect the B02 input to isolation amplifier 80 of analog board 42 (FIGS. 4A and 4B) and the CMIN input to operational amplifier 86 of the analog board 42. As mentioned above with respect to the description of analog board 42 of FIGS. 4A and 4B, this interconnection permits measurement of the common mode voltage, which appears as the output CMOUT of operational amplifier 86 of FIG. 4B.

DIP switches 98 are preset to provide a unique address for the particular control board 90 with which it is employed. As previously discussed, the controller 20 (FIGS. 1 and 2) can monitor up to six battery strings, and each battery string requires one multiplexer and load unit (such as unit 40 of FIG. 2). Thus, there can be up to six control boards associated with a given controller, and this makes it necessary that each control board 90 be uniquely identifiable by the CPU 26 (FIG. 2). DIP switches 98 serve this function.

Decoder 100 functions to identify address information provided thereto, such address information corresponding to the address or identity of a particular control board. If decoder 100 of control board 90 of FIG. 5 determines that the address information corresponds to the identity of the particular control board 90, decoder 100 activates latch 102. Depending on the particular address information, latch 102 turns on oscillator 94, oscillator 96 or FET 104, and this causes a transistor 154 in load tester 150 (FIG. 7) to be turned on so as to initiate a load test or battery bank charging, or to turn on photo MOS relay 109 so as to initiate common mode voltage measurement via CMOUT of operational amplifier 86 in analog board 42 (FIGS. 4A and 4B). The load testing and battery bank charging functions will be discussed in more detail with reference to FIG. 7.

LED's 102a–102d are turned on as a result of the operation of latch 102, and indicate which of the address lines and associated control functions are being activated by the latch 102.

Preferably, pulse transformers 110 and 112 are 1:1 pulse transformers. As previously indicated, transformers 110 and 112 provide isolation between control board 90 and MOSFET transistor 154 in the load tester 150 of FIG. 7.

Figure 6:
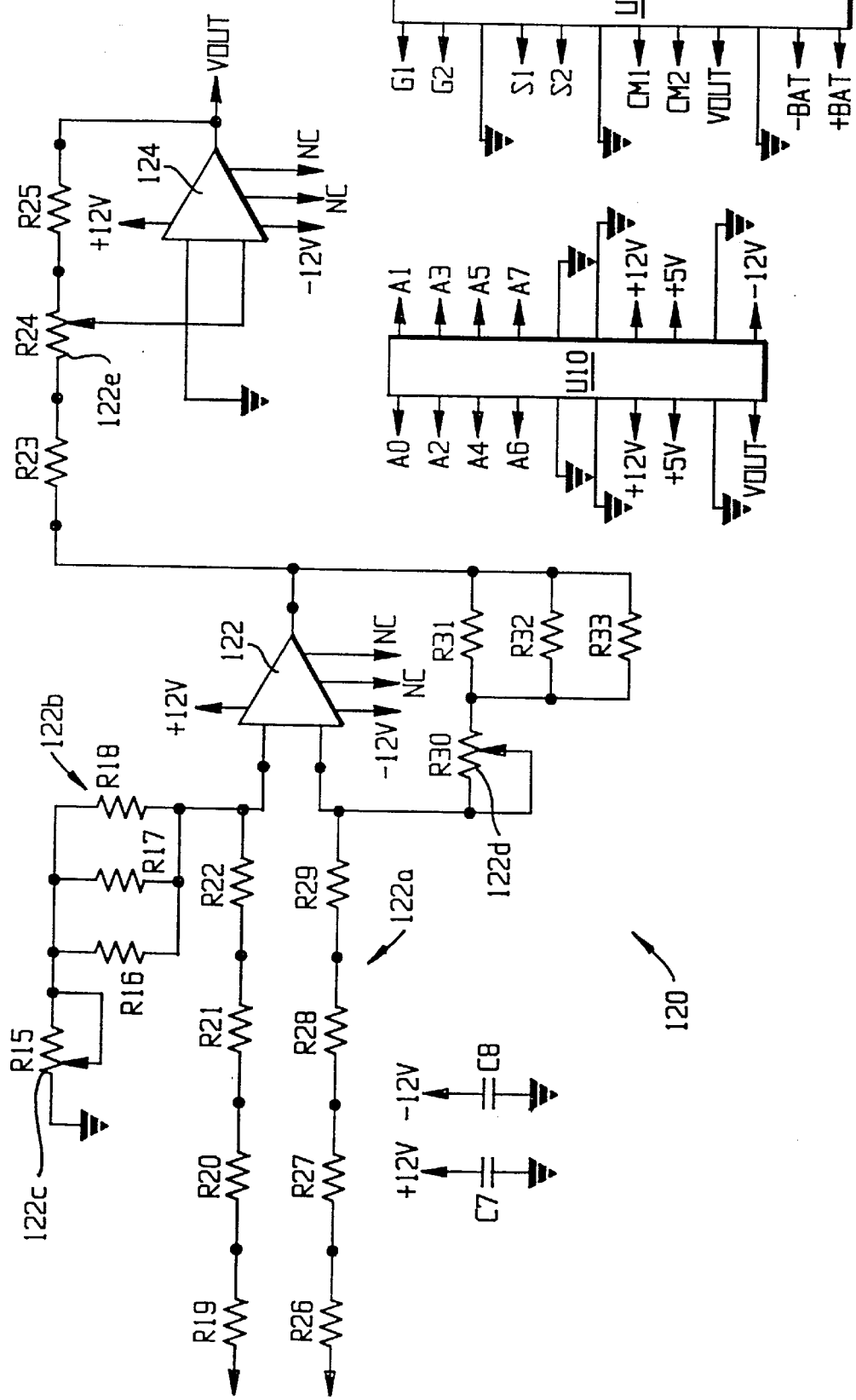
FIG. 6 is a circuit diagram of the voltage sensor circuitry of the battery monitoring system.

FIG. 6 is a circuit diagram of the voltage sensor circuitry of the battery monitoring system. As seen therein, voltage sensor circuitry 120 basically comprises operational amplifiers 122 and 124 with the various resistors (both fixed and variable) connected as shown. Various other elements are shown in FIG. 6, and perform functions which are obvious from this disclosure. For example, elements R15–R25 are resistors used to balance voltages and to provide calibration for various other circuit elements in the voltage sensor circuitry 120 of FIG. 6.

Voltage sensor circuitry 120 of FIG. 6 is utilized to measure pack voltage, as opposed to individual battery cell voltage. Inputs +BAT and –BAT are hard-wire connected to the positive and negative sides (that is, terminals 50a and 50b) of the battery pack 50 shown with; the load tester 150 of FIG. 7. A network in series-collected resistors 122a and a plurality of parallel-connected resistors 122b are provided at the input side of operational amplifier 122, a plurality of series-connected resistors being provided between each of the +BAT and –BAT inputs and the inverted and non-inverted inputs, respectively, of operational amplifier 122. The arrangement 122a, 122b of series-connected and parallel-connected resistors (preferably, resistors having a resistance of 250K ohms) comprises a divide-by-12 circuit which is accurately temperature-compensated. It should be noted that, whereas a 1M ohm resistor could have been used in place of four 250K ohm resistors in series, a 1M ohm resistor will have a different thermal characteristic than a 250K ohm resistor. In accordance with the invention, by using only 250K ohm resistors, the circuit output is stable as temperature changes, since identical resistors have identical thermal characteristics.

Further referring to FIG. 6, variable resistors 122c and 122d are used to zero operational amplifier 122, the divide-by-12 circuitry 122a, 122b, and further variable resistor 122e together with operational amplifier 124 and its associated circuitry. This "zero" technique is used to compensate for any tolerances associated with operational amplifier 122 and to adjust the gain exactly to a value appropriate to the voltage rating of the system being monitored (for example, to a value of $\frac{1}{12}$ for a 48-volt system). The output VOUT of operational amplifier 124 is then sent to the A/D converter 29 (FIG. 2) for digital conversion and subsequent processing by and storage in CPU 26. In this manner, the measurement of pack voltage is achieved by the system 10.

FIG. 7 is a circuit diagram of the load tester and battery isolation circuitry of the battery monitoring system. As seen therein, load tester 150 basically comprises FET's 152 and 154, shunt 156, Schotkey diodes 158 and 160, Zener diode 162, capacitor 164 and resistors 166 and 168.

The gate and source inputs G1, Si and G2, S2 to FET's 152 and 154, respectively, are provided by the control board 90 of FIG. 5, and specifically are the outputs of pulse transformers 112 and 110, respectively. As is well-known in the operation of such FET's, when the gate G1 or G2 closes, the source S1 or S2 is connected to the drain (not shown) of FET's 152 and 154, respectively.

In operation, FET 152 controls the charging of the battery pack 50. That is to say, when FET 152 is in the "open" state, the battery pack 50 is not charged; when FET 152 is in the "closed" state, the battery pack 50 is charged. Diodes 158 and 160 prevent charging of battery pack 50 when FET 152 is in the "open" state, while allowing the battery pack 50 to supply load if required. Resistors 166 and 168 are load resistors, and load the battery pack 50 during load testing.

When FET 154 is in the "open" state, loading of the battery pack 50 is prevented; when FET 154 is in the "closed" state, a load is applied across the terminals of battery pack 50. Zener diode 162 and capacitor 164 are provided for surge protection of the FET 154.

Further referring to FIG. 7, shunt 156 allows for measurement of voltage and current flow to and from battery pack 50 during load testing and charging. Connections 156a and 156b on opposite sides of the shunt 156 are connected to a channel of multiplexer 48 (FIG. 2). Multiplexer 48 is designated a "miscellaneous multiplexer" in that it differs from multiplexers 45–47.

More specifically, as previously explained, each of multiplexers 45, 46 and 47 serves a different bank of batteries (each containing up to eight battery cells). Multiplexer 48 is provided as a "miscellaneous multiplexer" to allow measurement of voltage not across a battery cell, but across the shunt 156. Such a measurement is representative of the current passing through the shunt 156 during either the charge or discharge stages of the battery pack 50.

Returning to FIG. 3, DIP switches 75 are set to identify multiplexer 48. Two of the inputs of multiplexer 48 (for example, the BO2 input of relay 76b and the BO1 input of relay 76c) are shorted together to allow for measurement of a known voltage (zero volts, since the inputs are tied together), thereby allowing for system self-nulling and automatic offset adjustment. If a voltage other than zero is measured across the two shorted inputs, then the voltage is subtracted from other measured voltage to provied automatic offset adjustment and assure system accurucy.

While preferred forms and arrangements have been shown in illustrating the invention, it is to be understood that various changes and modifications may be made without departing from the spirit and scope of this disclosure.

I claim:

1. A system for on-line monitoring of a plurality of battery cells, comprising:

controller means for selecting at least one battery cell to be monitored;

control board means connected to said controller means and responsive to address information for selectively providing at least one of a load test signal and a charging signal;

load board means connected to said control board means responsive to said load test signal for initiating a load test of said at least one battery cell and responsive to said charging signal for initiating a charging operation of said at least one battery cell; and wherein said load board means includes blocking circuitry connected to said plurality of battery cells for selectively preventing at least one of charging and load testing of said plurality of battery cells.

2. The system of claim 1, wherein said blocking circuitry comprises at least two diodes connected in parallel with each other to form a parallel diode arrangement disposed in series with said plurality of battery cells.

* * * * *